United States Patent
Nakazaki et al.

(10) Patent No.: US 12,221,595 B2
(45) Date of Patent: Feb. 11, 2025

(54) DECOMPOSING/CLEANING COMPOSITION, METHOD FOR CLEANING ADHESIVE POLYMER, AND METHOD FOR PRODUCING DEVICE WAFER

(71) Applicant: SHOWA DENKO K.K., Tokyo (JP)

(72) Inventors: Susumu Nakazaki, Tokyo (JP); Kuniaki Miyahara, Tokyo (JP); Tomoyuki Fukuyo, Tokyo (JP)

(73) Assignee: Resonac Corporation, Tokyo (JP)

( * ) Notice: Subject to any disclaimer, the term of this patent is extended or adjusted under 35 U.S.C. 154(b) by 640 days.

(21) Appl. No.: 17/420,569

(22) PCT Filed: Oct. 31, 2019

(86) PCT No.: PCT/JP2019/042936
§ 371 (c)(1),
(2) Date: Jul. 2, 2021

(87) PCT Pub. No.: WO2020/148968
PCT Pub. Date: Jul. 23, 2020

(65) Prior Publication Data
US 2022/0119739 A1    Apr. 21, 2022

(30) Foreign Application Priority Data

Jan. 15, 2019   (JP) .................. 2019-004292

(51) Int. Cl.
| | |
|---|---|
| *C11D 3/24* | (2006.01) |
| *B08B 3/08* | (2006.01) |
| *C11D 3/28* | (2006.01) |
| *C11D 3/30* | (2006.01) |
| *C11D 3/32* | (2006.01) |
| *C11D 3/34* | (2006.01) |
| *C11D 7/28* | (2006.01) |
| *C11D 7/32* | (2006.01) |
| *C11D 7/34* | (2006.01) |
| *C11D 7/50* | (2006.01) |
| *H01L 21/02* | (2006.01) |

(52) U.S. Cl.
CPC .............. *C11D 7/5013* (2013.01); *B08B 3/08* (2013.01); *C11D 3/28* (2013.01); *C11D 3/30* (2013.01); *C11D 3/32* (2013.01); *C11D 3/3445* (2013.01); *C11D 3/3481* (2013.01); *C11D 7/28* (2013.01); *C11D 7/3209* (2013.01); *C11D 7/3263* (2013.01); *C11D 7/3281* (2013.01); *C11D 7/34* (2013.01); *C11D 7/50* (2013.01); *H01L 21/02079* (2013.01); *B08B 2220/01* (2013.01); *B08B 2220/04* (2013.01); *C11D 2111/22* (2024.01)

(58) Field of Classification Search
CPC .......... C11D 3/28; C11D 3/32; C11D 3/3445; C11D 3/3481; C11D 3/30; C11D 7/28; C11D 3/3209; C11D 7/3263; C11D 7/3281; C11D 7/50

USPC ........ 510/175, 176, 238, 493, 500, 501, 504
See application file for complete search history.

(56) References Cited

U.S. PATENT DOCUMENTS

| | | | | |
|---|---|---|---|---|
| 7,247,208 B2 * | 7/2007 | Hsu | .......................... | C11D 3/43 |
| | | | | 134/28 |
| 2016/0010035 A1 * | 1/2016 | Liu | ..................... | C11D 11/0047 |
| | | | | 510/175 |
| 2017/0158888 A1 | 6/2017 | Kang et al. | | |

FOREIGN PATENT DOCUMENTS

| | | | |
|---|---|---|---|
| CN | 1526008 A | 9/2004 | |
| EP | 1612858 A2 * | 1/2006 | ......... C11D 11/0047 |
| JP | 2005-500408 A | 1/2005 | |
| JP | 2009-224621 A | 10/2009 | |
| JP | 2013-239595 A | 11/2013 | |
| JP | 2015-73056 A | 4/2015 | |
| KR | 10-1031926 B1 | 4/2011 | |
| KR | 10-2016-0087089 A | 7/2016 | |
| TW | I281944 B | 6/2007 | |
| TW | 201311882 A1 | 3/2013 | |
| TW | 201739909 A1 | 11/2017 | |
| WO | 03/006599 A1 | 1/2003 | |
| WO | WO-2005093032 A1 * | 10/2005 | ............. B82Y 40/00 |
| WO | 2014/061774 A1 | 4/2014 | |

OTHER PUBLICATIONS

Bing Xu et al., "Making Honeycomb Microcomposites by Soft Lithography", Advanced Materials, 1999, pp. 492-495, vol. 11, No. 6.
Shuichi Takayama et al., "Topographical Micropatterning of Poly(dimethylsiloxane) Using Laminar Flows of Liquids in Capillaries", Advanced Materials, 2001, pp. 570-574, vol. 13, No. 8.

(Continued)

*Primary Examiner* — Gregory R Delcotto
(74) *Attorney, Agent, or Firm* — Sughrue Mion, PLLC

(57) ABSTRACT

Provided is a decomposing/cleaning composition for an adhesive polymer having a high etching rate and suppressed infiltration into a contact interface between a substrate such as a device wafer and an adhesive layer such as a fixing tape. The decomposing/cleaning composition of one embodiment is a decomposing/cleaning composition for an adhesive polymer containing a quaternary alkylammonium fluoride or a quaternary alkylammonium fluoride hydrate and an aprotic solvent, wherein the aprotic solvent contains (A) an N-substituted amide compound having no active hydrogens on the nitrogen atoms and (B) at least one organic sulfur oxide selected from the group consisting of sulfoxide compounds and sulfone compounds.

19 Claims, No Drawings

(56) References Cited

OTHER PUBLICATIONS

Maya Kleiman et al., "Determination of Factors Influencing the Wet Etching of Polydimethylsiloxane Using Tetra-n-butylammonium Fluoride", Macromolecular Chemistry and Physics, 2016, pp. 284-291, vol. 217.
International Search Report for PCT/JP2019/042936 dated Jan. 28, 2020 (PCT/ISA/210).

* cited by examiner

DECOMPOSING/CLEANING COMPOSITION, METHOD FOR CLEANING ADHESIVE POLYMER, AND METHOD FOR PRODUCING DEVICE WAFER

CROSS REFERENCE TO RELATED APPLICATIONS

This application is a National Stage of International Application No. PCT/JP2019/042936 filed Oct. 31, 2019, claiming priority based on Japanese Patent Application No. 2019-004292 filed Jan. 15, 2019.

FIELD

The present disclosure relates to a decomposing cleaning composition, a method for cleaning an adhesive polymer, and a method for producing a device wafer. In particular, the present disclosure relates to a decomposing cleaning composition used for decomposing and cleaning an adhesive including an adhesive polymer used for temporary bonding between a device wafer and a support wafer (carrier wafer), the adhesive remaining on the device wafer in a thinning process of a semiconductor wafer, a method for cleaning the adhesive polymer using the decomposing cleaning composition, and a method for producing the device wafer.

BACKGROUND

In a three-dimensional mounting technology for densifying semiconductors, the thicknesses per sheet of semiconductor wafers are reduced, and a plurality of semiconductor wafers connected by a through silicon via (TSV) are laminated. Specifically, after thinning a device wafer having a semiconductor device formed thereon by polishing a surface (back surface) on which the semiconductor device is not formed, an electrode including a TSV is formed on the back surface.

In the polishing step of the back surface of the device wafer, in order to impart mechanical strength to the device wafer, a support wafer, also referred to as a carrier wafer, is temporarily bonded using an adhesive on a surface on which the semiconductor device is formed of the device wafer. For example, a glass wafer or a silicon wafer is used as the support wafer. After the polishing step, a metal wiring or an electrode pad containing Al, Cu, Ni, Au, etc., an inorganic film, such as an oxide film or a nitride film, or a resin layer containing a polyimide, etc., is formed on the polished surface (back surface) of the device wafer, as necessary. Thereafter, the device wafer is fixed to a tape, which has an acrylic adhesive layer and is secured by a ring frame, by attaching the back surface of the device wafer to the tape. The device wafer is then separated (debonded) from the support wafer, the adhesive on the device wafer is peeled off, and the adhesive residue on the device wafer is cleaned off using a cleaning agent.

An adhesive including a polyorganosiloxane compound having good heat resistance as an adhesive polymer is used for temporary bonding application of a device wafer. In particular, when the adhesive is a crosslinked polyorganosiloxane compound, two actions of cleavage of an Si—O bond and dissolution of a decomposed product by a solvent are required for a cleaning agent. Examples of such a cleaning agent include those obtained by dissolving a fluorine-based compound, such as tetrabutylammonium fluoride (TBAF) in a polar aprotic solvent. Since a fluoride ion of TBAF participates in the cleavage of an Si—O bond via Si—F bond formation, the cleaning agent can be provided with etch performance. Since the polar aprotic solvent can dissolve TBAF and does not form solvation via a hydrogen bonding with the fluoride ion, the reactivity of the fluoride ion can be increased.

In Non-Patent Literature 1 (Advanced Materials, 11, 6, 492 (1999)), a 1.0 M TBAF solution using THF, which is aprotic, as a solvent is used for decomposing, and dissolving and removing polydimethylsiloxane (PDMS).

In Non-Patent Literature 2 (Advanced Materials, 13, 8, 570 (2001)), NMP, DMF or DMSO, which is an aprotic solvent as with THF, are used as a solvent of TBAF.

Non-Patent Literature 3 (Macromolecular Chemistry and Physics, 217, 284-291 (2016)) describes results of examining PDMS etch rates with TBAF/organic solvents for each solvent, and also describes, with respect to THF and DMF, which have a high etch rate, a comparison of etch rates of TBAF solutions using mixed solvents having different ratios of THF/DMF.

Patent Literature 1 (KR 10-2016-0087089 A) and Patent Literature 2 (US 2017/0158888 A1) describe cleaning liquids in which TBAF is dissolved in a solvent of a nitrogen-containing heterocyclic compound.

As a tape for fixing a device wafer which has been thinned after a polishing step, for example, an adhesive tape in which an acrylic pressure sensitive adhesive layer is formed on a polyester substrate is used. On the contact surface of the device wafer with the fixing tape, there may be a metal wiring or electrode pad containing Al, Cu, Ni, Au, etc., an inorganic film, such as an oxide film and a nitride film, or a resin layer containing a polyimide, etc., formed after the polishing step, and if a component included in the cleaning agent comes into contact with these metals, inorganic materials, or organic materials, corrosion or deterioration of these materials may occur.

In addition, when the cleaning agent penetrates between the device wafer and the acrylic pressure sensitive adhesive layer during cleaning, the acrylic pressure sensitive adhesive layer may be dissolved or swollen by an organic solvent component in the cleaning agent, or wrinkles may be generated in the acrylic pressure sensitive adhesive layer. When the device wafer is peeled off from the fixing tape in such a state, a part of the acrylic pressure sensitive adhesive layer may remain on the device wafer, that is, an adhesive residue or contamination may occur.

Thus, it is required that a cleaning agent not penetrate into a contact interface between a fixing tape and a device wafer, in order to protect a material of the back surface of the device wafer and prevent occurrence of an adhesive residue. To meet this requirement, attempts have been made to focus on the configuration of a fixing tape or the material of an acrylic pressure sensitive adhesive layer.

In Patent Literature 3 (WO 2014/061774), in a pressure sensitive adhesive sheet including a pressure sensitive adhesive layer, a substrate film and a substrate protection film in this order, a solvent-resistant substrate protection film is laminated on the substrate film to suppress dissolution of the substrate film in an organic solvent or occurrence of wrinkles, thereby preventing the organic solvent from entering between the pressure sensitive adhesive layer and a wafer.

In Patent Literature 4 (JP 2015-73056 A), by setting the mass ratio of methyl (meth)acrylate with respect to the entire mass of an acrylic copolymer, the mass ratio of a crosslinking agent, and the gel fraction within predetermined ranges, solvent resistance is improved against limonene which is a low polarity organic solvent.

Similarly, Patent Literature 5 (JP 2009-224621 A) describes that a pressure sensitive adhesive layer having a gel fraction in a predetermined range, formed from a radiation curable acrylic resin composition, is excellent in solvent resistance, and Patent Literature 6 (JP 2013-239595 A) describes a method for improving solvent resistance of a dicing tape comprising, in a dicing tape, curing by ultraviolet irradiation a region where a semiconductor wafer or a ring frame is not adhered to modify a pressure sensitive adhesive layer in a region in contact with an organic solvent.

CITATION LIST

Patent Literature

[PTL 1] KR 10-2016-0087089 A
[PTL 2] US 2017/0158888 A1
[PTL 3] WO 2014/061774
[PTL 4] JP 2015-73056 A
[PTL 5] JP 2009-224621 A
[PTL 6] JP 2013-239595 A

NON-PATENT LITERATURE

[NPL 1] Advanced Materials, 11, 6, 492(1999)
[NPL 2] Advanced Materials, 13, 8, 570 (2001)
[NPL 3] Macromolecular Chemistry and Physics, 217, 284-291 (2016)

SUMMARY

Technical Problem

It is considered that the role of a solvent in a cleaning agent containing a fluorine compound, such as TBAF, and the solvent is to sufficiently dissolve the fluorine compound which is highly polar and a reactive substance, thereby making the affinity of the fluorine compound for a surface of a less polar adhesive sufficient to ensure reactivity of fluoride ions included in the fluorine compound, and to dissolve a decomposed product of the adhesive. In some cases, a substituent is introduced into an adhesive polymer contained in an adhesive for the purpose of improving heat resistance, releasability, etc., whereby the surface of the adhesive may exhibit various polarities. It is desirable that the cleaning agent exhibit excellent affinity for the surface of the adhesive exhibiting such various polarities, thereby achieving a high etch rate.

On the other hand, in a step of cleaning and removing the adhesive, it is required that the cleaning agent not penetrate between the pressure sensitive adhesive layer of the fixing tape to which the device wafer is attached and the device wafer. It is undesirable to impart solvent resistance against an organic solvent component of the cleaning agent to the fixing tape, or to modify the pressure sensitive adhesive layer by UV irradiation only in a predetermined region of the fixing tape to import solvent resistance to the pressure sensitive adhesive layer, since these require changes in the material of the fixing tape or the manufacturing process. Rather, there is a need to improve the composition and properties of the cleaning agent so as not to dissolve or swell the acrylic pressure sensitive adhesive layer or penetrate the acrylic pressure sensitive adhesive layer, without requiring any changes in the material of the fixing tape or the manufacturing process.

The present disclosure provides a decomposing cleaning composition of an adhesive polymer having a high etch rate wherein penetration of the composition into a contact interface between a substrate, such as a device wafer, and a pressure sensitive adhesive layer, such as that of a fixing tape, is suppressed.

Solution to Problem

The present inventors have found that, in a decomposing cleaning composition of an adhesive polymer comprising a quaternary alkylammonium fluoride or a hydrate thereof, by using a specific plurality of aprotic solvents in combination, the penetration of the decomposing cleaning composition into a contact interface of a substrate and a pressure sensitive adhesive layer can be suppressed, while ensuring an etch rate of the decomposing cleaning composition.

That is, the present invention includes the following [1] to [16].

[1]
A decomposing cleaning composition of an adhesive polymer comprising a quaternary alkylammonium fluoride or a hydrate of a quaternary alkylammonium fluoride, and an aprotic solvent, wherein the aprotic solvent comprises
(A) an N-substituted amide compound having no active hydrogen on a nitrogen atom, and
(B) at least one organic sulfur oxide selected from the group consisting of a sulfoxide compound and a sulfone compound.

[2]
The decomposing cleaning composition according to [1], wherein the (A) N-substituted amide compound is a 2-pyrrolidone derivative compound represented by the formula (1):

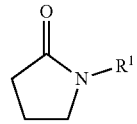

(1)

wherein, in the formula (1), $R^1$ represents an alkyl group having 1 to 4 carbon atoms.

[3]
The decomposing cleaning composition according to [2], wherein the (A) N-substituted amide compound is a 2-pyrrolidone derivative compound wherein $R^1$ in the formula (1) is a methyl group or an ethyl group.

[4]
The decomposing cleaning composition according to any one of [1] to [3], wherein the sulfoxide compound is a cyclic sulfoxide compound having 4 to 6 carbon atoms, or an acyclic sulfoxide compound represented by the formula (2):

$R^2(SO)R^3$ (2), wherein, in the formula (2), $R^2$ and $R^3$ each independently represent an alkyl group selected from the group consisting of a methyl group, an ethyl group, an n-propyl group, an isopropyl group, an n-butyl group, an isobutyl group, a sec-butyl group, and a t-butyl group.

[5]
The decomposing cleaning composition according to [4], wherein the sulfoxide compound is dimethyl sulfoxide.

[6]
The decomposing cleaning composition according to any one of [1] to [5], wherein the sulfone compound is a cyclic sulfone compound having 4 to 6 carbon atoms, or an acyclic sulfone compound represented by the formula (3):

$$R^4(SO_2)R^5 \qquad (3),$$

wherein, in the formula (3), $R^4$ and $R^5$ each independently represent a group selected from the group consisting of an alkyl group having 1 to 8 carbon atoms, a phenyl group, and a benzyl group.

[7]

The decomposing cleaning composition according to [6], wherein the sulfone compound is sulfolane or 3-methylsulfolane.

[8]

The decomposing cleaning composition according to any one of [1] to [7], wherein the content of the (A) N-substituted amide compound is 10 to 99.9% by mass and the content of the (B) organic sulfur oxide is 0.1 to 90% by mass, with respect to 100% by mass of the aprotic solvent.

[9]

The decomposing cleaning composition according to any one of [1] to [7], wherein the content of the (A) N-substituted amide compound is 70 to 98% by mass and the content of the (B) organic sulfur oxide is 2 to 30% by mass, with respect to 100% by mass of the aprotic solvent.

[10]

The decomposing cleaning composition according to any one of [1] to [9], wherein the content of the quaternary alkylammonium fluoride is 0.1 to 15% by mass.

[11]

The decomposing cleaning composition according to any one of [1] to [10], wherein the quaternary alkylammonium fluoride is a tetraalkylammonium fluoride represented by $R^6R^7R^8R^9N^+F^-$, wherein $R^6$ to $R^9$ are each independently an alkyl group selected from the group consisting of a methyl group, an ethyl group, an n-propyl group, an isopropyl group, and an n-butyl group.

[12]

The decomposing cleaning composition according to any one of [1] to [11], wherein the adhesive polymer is a polyorganosiloxane compound.

[13]

A method for cleaning an adhesive polymer on a substrate by using the decomposing cleaning composition according to any one of [1] to [12].

[14]

The method according to [13], comprising carrying out the cleaning with the substrate in contact with an acrylic pressure sensitive adhesive.

[15]

A method for producing a device wafer comprising cleaning an adhesive polymer on a front surface of a device wafer by using the decomposing cleaning composition according to any one of [1] to [2].

[16]

The method according to [15], comprising carrying out the cleaning with the device wafer in contact with an acrylic pressure sensitive adhesive.

Advantageous Effects of Invention

The decomposing cleaning composition of the present disclosure has a high affinity for an adhesive polymer, and therefore has a high etch rate, and can suppress penetration of the decomposing cleaning composition into a contact interface between a substrate, such as a device wafer, and a pressure sensitive adhesive layer, such as that of a fixing tape. Therefore, the decomposing cleaning composition of the present disclosure can be used as a high performance cleaning agent for cleaning and removing an adhesive polymer, which does not require, for example, a change in the material of the fixing tape of the device wafer and the manufacturing process.

The foregoing description should not be considered as disclosing all embodiments of the present invention and all advantages thereof.

DESCRIPTION OF EMBODIMENTS

Hereinafter, the present invention will be described in further detail.

[Decomposing Cleaning Composition]

A decomposing cleaning composition according to one embodiment comprises a quaternary alkylammonium fluoride or a hydrate of a quaternary alkylammonium fluoride, and a specific aprotic solvent. The aprotic solvent includes (A) an N-substituted amide compound having no active hydrogen on a nitrogen atom, and (B) at least one organic sulfur oxide selected from the group consisting of a sulfoxide compound and a sulfone compound.

<Quaternary Alkylammonium Fluoride or Hydrate Thereof>

The quaternary alkylammonium fluoride or a hydrate thereof releases a fluoride ion which is involved in cleavage of an Si—O bond. A quaternary alkylammonium moiety can allow the quaternary alkylammonium fluoride, which is a salt, to dissolve in an aprotic solvent. As the quaternary alkylammonium fluoride, various compounds can be used without any particular limitation. Examples of the hydrate of the quaternary alkylammonium fluoride include trihydrates, tetrahydrates, and pentahydrates. The quaternary alkylammonium fluoride may be one or a combination of two or more thereof.

In one embodiment, the quaternary alkylammonium fluoride is a tetraalkylammonium fluoride represented by $R^6R^7R^8R^9N^+F^-$, wherein $R^6$ to $R^9$ are each independently an alkyl group selected from the group consisting of a methyl group, an ethyl group, an n-propyl group, an isopropyl group, and an n-butyl group. Examples of such a quaternary alkylammonium fluoride include tetramethylammonium fluoride, tetraethylammonium fluoride, tetrapropylammonium fluoride, and tetrabutylammonium fluoride. From the viewpoint of decomposing cleaning performance, availability, prices, etc., it is preferable that the quaternary alkylammonium fluoride be tetrabutylammonium fluoride (TBAF).

The content of the quaternary alkylammonium fluoride in the decomposing cleaning composition is preferably 0.1 to 15% by mass, more preferably 1.0 to 10% by mass, and still more preferably 3.0 to 8.0% by mass. The "content of the quaternary alkylammonium fluoride" is a value converted as a mass of only the quaternary alkylammonium fluoride, excluding the mass of hydrate water, when a hydrate of the quaternary alkylammonium fluoride is contained in the decomposing cleaning composition. By setting the content of the quaternary alkylammonium fluoride to 0.1% by mass or more, an adhesive polymer can be effectively decomposed and cleaned, and by setting the content to 15% by mass or less, corrosion of a metal portion included in a device forming surface of a device wafer can be prevented or suppressed.

In an embodiment in which the (B) organic sulfur oxide is a sulfoxide compound, the content of the quaternary alkylammonium fluoride in the decomposing cleaning composition is preferably 0.1 to 15% by mass, more preferably 1.0 to 10% by mass, and still more preferably 2.0 to 8.0% by mass. In this embodiment, by setting the content of the quaternary alkylammonium fluoride to 0.1% by mass or more, an adhesive polymer can be effectively decomposed and cleaned, and by setting the content to 15% by mass or less, corrosion of a metal portion included in a device forming surface of a device wafer can be prevented or suppressed.

In an embodiment in which the (B) organic sulfur oxide is a sulfone compound, the content of the quaternary alkylammonium fluoride in the decomposing cleaning composition is preferably 0.1 to 15% by mass, more preferably 0.5 to 10% by mass, and still more preferably 1.0 to 5.0% by mass. In this embodiment, by setting the content of the quaternary alkylammonium fluoride to 0.1% by mass or more, an adhesive polymer can be effectively decomposed and cleaned, and by setting the content to 15% by mass or less, corrosion of a metal portion included in a device forming surface of a device wafer can be prevented or suppressed.

<Aprotic Solvent>

The aprotic solvent includes (A) an N-substituted amide compound having no active hydrogen on a nitrogen atom, and (B) at least one organic sulfur oxide selected from the group consisting of a sulfoxide compound and a sulfone compound. Since these aprotic solvents are compatible with water, after decomposing cleaning of an adhesive polymer, a substrate or device wafer can be rinsed with water, which is inexpensive and safe.

In one embodiment, the content of the aprotic solvent in the decomposing cleaning composition is 70 to 99.9% by mass, preferably 80 to 99% by mass, and more preferably 9 to 99% by mass.

<(A) N-Substituted Amide Compound Having No Active Hydrogen on Nitrogen Atom>

The (A) N-substituted amide compound having no active hydrogen on a nitrogen atom (also simply referred to as "(A) N-substituted amide compound" in the present disclosure) is an aprotic solvent having a relatively high polarity, and able to uniformly dissolve or disperse the quaternary alkylammonium fluoride and a hydrate thereof in the decomposing cleaning composition. In the present disclosure, "(A) N-substituted amide compound" also encompasses a urea compound (carbamide compound) having no active hydrogen on a nitrogen atom. As the (A) N-substituted amide compound, various compounds can be used without any particular limitation. In one embodiment, the number of carbon atoms of the (A) N-substituted amide compound is preferably 3 to 12. Examples of the (A) N-substituted amide compound include acyclic N-substituted amides, such as N,N-dimethylformamide. N,N-diethylformamide. N,N-dimethylacetamide, N,N-diethylacetamide, N,N-dimethylpropionamide, N,N-diethylpropionamide, and tetramethylurea, and cyclic N-substituted amides, such as 2-pyrrolidone derivatives, 2-piperidone derivatives, ε-caprolactam derivatives, 1,3-dimethyl-2-imidazolidinone, 1-methyl-3-ethyl-2-imidazolidinone, 1,3-diethyl-2-imidazolidinone, and 1,3-dimethyl-3,4,5,6-tetrahydro-2(1H)-pyrimidinone (N,N'-dimethylpropyleneurea). The (A) N-substituted amide compound may be one or a combination of two or more thereof.

In one embodiment, it is preferable that the (A) N-substituted amide compound be a 2-pyrrolidone derivative compound represented by the formula (1):

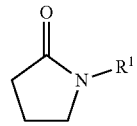

(1)

wherein, in the formula (1), $R^1$ represents an alkyl group having 1 to 4 carbon atoms. Examples of the alkyl group having 1 to 4 carbon atoms include a methyl group, an ethyl group, an n-propyl group, an isopropyl group, an n-butyl group, an isobutyl group, a sec-butyl group, and a t-butyl group, and a methyl group or an ethyl group is preferred. Examples of the 2-pyrrolidone derivative compound represented by the formula (1) include N-methylpyrrolidone, N-ethylpyrrolidone, N-propylpyrrolidone, and N-butylpyrrolidone.

The (A) N-substituted amide compound is preferably a 2-pyrrolidone derivative compound in which $R^1$ is a methyl group or an ethyl group in the formula (1), and more preferably a 2-pyrrolidone derivative compound in which $R^1$ is a methyl group in the formula (1), i.e., N-methylpyrrolidone, since they have relatively high polarity and excellent dissolving ability of the quaternary alkylammonium fluoride, and are easily available.

<(B) Organic Sulfur Oxide>

By combining at least one of the (B) organic sulfur oxides selected from the group consisting of a sulfoxide compound and a sulfone compound with the (A) N-substituted amide compound, a mixed solvent system exhibiting high affinity for an adhesive polymer can be formed. The decomposing cleaning composition using such a mixed solvent system can achieve a high etch rate in which the reaction activity of the quaternary alkylammonium fluoride is effectively utilized, and can reduce the affinity of the decomposing cleaning composition for a pressure sensitive adhesive layer of a device wafer fixing tape, particularly the affinity for an acrylic pressure sensitive adhesive layer, thereby suppressing penetration of the decomposing cleaning composition into a contact interface between a substrate and the pressure sensitive adhesive layer. As the (B) organic sulfur oxide, various compounds can be used without any particular limitation, as long as they are a sulfoxide compound or a sulfone compound. The (B) organic sulfur oxide may be one or a combination of two or more thereof.

In one embodiment, it is preferable that the sulfoxide compound be a cyclic sulfoxide compound having 4 to 6 carbon atoms, or an acyclic sulfoxide compound represented by the formula (2):

$$R^2(SO)R^3 \tag{2}$$

wherein, in the formula (2), $R^2$ and $R^3$ each independently represent an alkyl group selected from the group consisting of a methyl group, an ethyl group, an n-propyl group, an isopropyl group, an n-butyl group, an isobutyl group, a sec-butyl group, and a t-butyl group.

Examples of the cyclic sulfoxide compound having 4 to 6 carbon atoms include tetramethylene sulfoxide (tetrahydrothiophene 1-oxide), 3-methyltetramethylene sulfoxide, and 2,4-dimethyltetramethylene sulfoxide. It is preferable that the cyclic sulfoxide compound having 4 to 6 carbon atoms be tetramethylene sulfoxide, from the viewpoint of decomposing cleaning performance, availability, prices, etc.

Examples of the acyclic sulfoxide compound represented by the formula (2) include dimethyl sulfoxide, diethyl sulfoxide, di(n-propyl) sulfoxide, di(isopropyl) sulfoxide, di(n-butyl) sulfoxide, di(isobutyl) sulfoxide, di(sec-butyl) sulfoxide, di(t-butyl) sulfoxide, methyl ethyl sulfoxide, and methyl isobutyl sulfoxide. In the acyclic sulfoxide compound represented by the formula (2), it is preferable that $R^2$ and $R^3$ be each independently a methyl group, an ethyl group, or an isopropyl group. It is preferable that the acyclic sulfoxide compound represented by the formula (2) be dimethyl sulfoxide, from the viewpoint of decomposing cleaning performance, availability, prices, etc.

In one embodiment, it is preferable that the sulfone compound be a cyclic sulfone compound having 4 to 6 carbon atoms, or an acyclic sulfone compound represented by the formula (3):

$$R^4(SO_2)R^5 \quad (3)$$

wherein, in the formula (3), $R^4$ and $R^5$ each independently represent a group selected from the group consisting of an alkyl group having 1 to 8 carbon atoms, a phenyl group, and a benzyl group.

Examples of the cyclic sulfone compound having 4 to 6 carbon atoms include sulfolane (tetrahydrothiophene 1,1-dioxide), 3-methylsulfolane (tetrahydro-3-methylthiophene 1,1-dioxide), and 2,4-dimethylsulfolane (tetrahydro-2,4-dimethylthiophene 1,1-dioxide). The cyclic sulfone compound having 4 to 6 carbon atoms is preferably sulfolane or 3-methylsulfolane, and more preferably sulfolane, from the viewpoint of decomposing cleaning performance, availability, prices, etc.

Examples of the acyclic sulfone compound represented by the formula (3) include dimethyl sulfone, ethyl methyl sulfone, diethyl sulfone, isopropyl methyl sulfone, ethyl isopropyl sulfone, dibutyl sulfone, di(n-octyl) sulfone, benzyl phenyl sulfone, and diphenyl sulfone. In the acyclic sulfone compound represented by the formula (3), it is preferable that $R^4$ and $R^5$ be each independently a methyl group, an ethyl group, or an isopropyl group. The acyclic sulfone compound represented by the formula (3) is preferably ethyl methyl sulfone or ethyl isopropyl sulfone, from the viewpoint of decomposing cleaning performance, availability, prices, etc.

In one embodiment, when the aprotic solvent is 100% by mass, it is preferable that the content of the (A) N-substituted amide compound be 10 to 99.9% by mass, and the content of the (B) organic sulfur oxide be 0.1 to 90% by mass; it is more preferable that the content of the (A) N-substituted amide compound be 30 to 99% by mass, and the content of the (B) organic sulfur oxide be 1 to 70% by mass; it is further preferable that the content of the (A) N-substituted amide compound be 50 to 99% by mass, and the content of the (B) organic sulfur oxide be 1 to 50% by mass; and it is still more preferable that the content of the (A) N-substituted amide compound be 70 to 98% by mass, and the content of the (B) organic sulfur oxide be 2 to 30% by mass. In this embodiment, by setting the contents of the (A) N-substituted amide compound and the (B) organic sulfur oxide within the above ranges, the quaternary alkylammonium fluoride and the hydrate thereof can be uniformly dissolved in the decomposing cleaning composition, and a higher etch rate can be obtained for various adhesive polymers, and the affinity of the decomposing cleaning composition with a pressure sensitive adhesive layer of a device wafer fixing tape, particularly the affinity with an acrylic pressure sensitive adhesive layer, can be effectively reduced to further suppress the penetration of the decomposing cleaning composition into a contact interface of a substrate and the pressure sensitive adhesive layer.

In an embodiment in which the (B) organic sulfur oxide is the sulfoxide compound, when the aprotic solvent is 100% by mass, it is preferable that the content of the (A) N-substituted amide compound be 10 to 90% by mass, and the content of the sulfoxide compound be 10 to 90% by mass; it is more preferable that the content of the (A) N-substituted amide compound be 30 to 80% by mass, and the content of the sulfoxide compound be 20 to 70% by mass; and it is further preferable that the content of the (A) N-substituted amide compound be 50 to 70% by mass, and the content of the sulfoxide compound be 30 to 50% by mass. In this embodiment, by setting the contents of the (A) N-substituted amide compound and the sulfoxide compound within the above ranges, the quaternary alkylammonium fluoride and the hydrate thereof can be uniformly dissolved in the decomposing cleaning composition, and a higher etch rate can be obtained for various adhesive polymers, and the affinity of the decomposing cleaning composition with a pressure sensitive adhesive layer of a device wafer fixing tape, particularly the affinity with an acrylic pressure sensitive adhesive layer, can be effectively reduced to further suppress the penetration of the decomposing cleaning composition into a contact interface of a substrate and the pressure sensitive adhesive layer.

In an embodiment in which the (B) organic sulfur oxide is the sulfone compound, when the aprotic solvent is 100% by mass, it is preferable that the content of the (A) N-substituted amide compound be 60 to 99.9% by mass, and the content of the sulfone compound be 0.1 to 40% by mass; it is more preferable that the content of the (A) N-substituted amide compound be 85 to 99.9% by mass, and the content of the sulfone compound be 0.1 to 15% by mass; and it is further preferable that the content of the (A) N-substituted amide compound be 96 to 99% by mass, and the content of the sulfone compound be 1 to 4% by mass. In this embodiment, by setting the contents of the (A) N-substituted amide compound and the sulfone compound within the above ranges, the quaternary alkylammonium fluoride and the hydrate thereof can be uniformly dissolved in the decomposing cleaning composition, and a higher etch rate can be obtained for various adhesive polymers, and the affinity of the decomposing cleaning composition with a pressure sensitive adhesive layer of a device wafer fixing tape, particularly the affinity with an acrylic pressure sensitive adhesive layer, can be effectively reduced to further suppress the penetration of the decomposing cleaning composition into a contact interface of a substrate and the pressure sensitive adhesive layer.

The (B) organic sulfur oxide may be a combination of the sulfoxide compound and the sulfone compound. In this embodiment, when the aprotic solvent is 100% by mass, it is preferable that the content of the (A) N-substituted amide compound be 10 to 89.9% by mass, the content of the sulfoxide compound be 10 to 80% by mass, and the content of the sulfone compound be 0.1 to 40% by mass. In this embodiment, by setting the contents of the (A) N-substituted amide compound, the sulfoxide compound, and the sulfone compound within the above range, the quaternary alkylammonium fluoride and the hydrate thereof can be uniformly dissolved in the decomposing cleaning composition, and a higher etch rate can be obtained for various adhesive polymers, and the affinity of the decomposing cleaning composition with a pressure sensitive adhesive layer of a device wafer fixing tape, particularly the affinity with an acrylic pressure sensitive adhesive layer, can be effectively reduced to further suppress the penetration of the decomposing cleaning composition into a contact interface of a substrate and the pressure sensitive adhesive layer.

<Additives and Other Ingredients>

The decomposing cleaning composition may contain, as an optional component, additives, such as an antioxidant, a surfactant, a preservative, and an antifoaming agent, within a range not significantly impairing the effect of the present invention.

It is preferable that the decomposing cleaning composition have a less content of a protic solvent. For example, it is preferable that the content of the protic solvent in the decomposing cleaning composition be 5% by mass or less, 3% by mass or less, or 1% by mass or less. The protic solvent that may be contained in the decomposing cleaning composition may be water derived from the hydrate of the quaternary alkylammonium fluoride.

In one embodiment, the decomposing cleaning composition is substantially free or free of a sulfonic acid compound. For example, the content of the sulfonic acid compound in the decomposing cleaning composition may be 1% by mass or less, 0.5% by mass or less, or 0.1% by mass or less. In this embodiment, corrosion or deterioration of a metal or an inorganic material present on the back surface of a device wafer, etc., by an acidic component can be prevented.

[Method for Cleaning Adhesive Polymer]

The decomposing cleaning composition of the present disclosure can be used as a decomposing cleaning composition of an adhesive polymer contained in various adhesives. The adhesive polymer is not particularly limited as long as it can be cleaned by using the decomposing cleaning composition of the present disclosure. In addition to the adhesive polymer, the adhesive may contain, as an optional component, a curing agent, a curing accelerator, a crosslinking agent, a surfactant, a leveling agent, a filler, etc.

In one embodiment, the adhesive polymer includes an Si—O bond. The adhesive polymer is reduced in molecular weight or loses its crosslinked structure due to cleavage of an Si—O bond by a fluoride ion of the quaternary alkylammonium fluoride, so that it can be dissolved in the aprotic solvent, and as a result, the adhesive polymer can be removed from a surface of a substrate, such as a device wafer.

The adhesive polymer including an Si—O bond is preferably a polyorganosiloxane compound. Since the polyorganosiloxane compound includes a large number of siloxane (Si—O—Si) bonds, it can be effectively decomposed and cleaned by using the decomposing cleaning composition. Examples of the polyorganosiloxane compound include silicone elastomers, silicone gels, and silicone resins, such as MQ resins, and modified products thereof, such as epoxy-modified products, acrylic-modified products, methacrylic-modified products, amino-modified products, and mercapto-modified products thereof. The polyorganosiloxane compound may be a silicone-modified polymer, such as a silicone-modified polyurethane, and a silicone-modified acrylic resin.

In one embodiment, the adhesive polymer is an addition-curable silicone elastomer, a silicone gel, or a silicone resin. These addition-curable silicones contain an ethylenically unsaturated group-containing polyorganosiloxane, such as a vinyl-terminated polydimethylsiloxane or a vinyl-terminated MQ resin, and a polyorganohydrosiloxane, such as a polymethylhydrosiloxane, as a crosslinking agent, and are cured by using a hydrosilylation catalyst, such as a platinum catalyst.

In another embodiment, the adhesive polymer includes an aralkyl group-, epoxy group-, or phenyl group-containing polydiorganosiloxane, in particular, an aralkyl group-, epoxy group-, or phenyl group-containing polydimethylsiloxane. An adhesive containing such an adhesive polymer may be used for temporary bonding, in combination with an adhesive containing the addition-curable silicone described above.

Cleaning of an adhesive polymer on a substrate, such as a device wafer, can be carried out in various conventionally known methods using the decomposing cleaning composition. A method for cleaning an adhesive polymer includes, for example, discharging the decomposing cleaning composition onto a substrate so that the decomposing cleaning composition contacts an adhesive polymer while rotating the substrate at a predetermined speed using a spin coater, etc., (spin etch), spraying the decomposing cleaning composition onto an adhesive polymer on a substrate (spraying), or immersing a substrate having thereon an adhesive polymer in a tank containing the decomposing cleaning composition (dipping). The temperature of the decomposing cleaning may vary depending on the type of the adhesive polymer and the deposited amount thereof on the substrate, and is generally 20° C. to 90° C., and preferably 40° C. to 60° C. The time of the decomposing cleaning may vary depending on the type of the adhesive polymer and the deposited amount thereof on the substrate, and is generally 5 seconds to 10 hours, and preferably 10 seconds to 2 hours. During the decomposing cleaning, ultrasonic may be applied to a bath of the decomposing cleaning composition or the substrate. Cleaning of the adhesive polymer may be carried out in a state in which the back surface of the substrate is fixed with a fixing tape having an acrylic pressure sensitive adhesive.

After the decomposing cleaning, the substrate may be rinsed using an alcohol, such as isopropyl alcohol (IPA), or water, such as ion-exchanged water (DIW), and the substrate may be dried by spraying with nitrogen gas, air, etc., or heating under normal pressure or under reduced pressure, etc. Since the aprotic solvent contained in the decomposing cleaning composition is compatible with water, the substrate can be rinsed with inexpensive and safe water.

[Method for Producing Device Wafer]

In one embodiment, a method for producing a device wafer includes cleaning an adhesive polymer on the front surface of a device wafer by using the decomposing cleaning composition. After the cleaning, if necessary, the device wafer may be rinsed using an alcohol, such as isopropyl alcohol (IPA), or water, such as ion-exchanged water (DIW), and the device wafer may be dried by spraying with nitrogen gas, air, etc., or heating under normal pressure or under reduced pressure. Since the aprotic solvent contained in the decomposing cleaning composition is compatible with water, the device wafer can be rinsed with inexpensive and safe water.

A method for producing a device wafer may further include: forming a semiconductor device on a substrate, such as a silicon wafer, to obtain a device wafer; opposing a surface of the device wafer on which the semiconductor device is formed and a support wafer to temporarily bond the device wafer and the support wafer via an adhesive containing an adhesive polymer; thinning the device wafer by polishing a surface (back surface) opposite the surface of the device wafer on which the semiconductor device is formed; and separating the support wafer from the device wafer. Formation of the semiconductor device, temporary bonding of the device wafer and the support wafer, polishing of the back surface of the device wafer, and separation of the device wafer from the support wafer can be carried out in conventionally known methods and are not particularly limited.

The method for producing a device wafer may further include forming a through electrode, an insulating film, or a circuit on the back surface of the device wafer, after the device wafer is thinned.

The method for producing a device wafer may further include adhering an acrylic pressure sensitive adhesive layer of a fixing tape having the acrylic pressure sensitive adhesive layer to the back surface of the device wafer, after the device wafer is thinned. In a state in which the device wafer is in contact with the acrylic pressure sensitive adhesive, the adhesive polymer on the front surface of the device wafer may be cleaned using the decomposing cleaning composition.

The acrylic pressure sensitive adhesive layer may contain a UV curable acrylic pressure sensitive adhesive. The UV curable acrylic pressure sensitive adhesive generally contains a pressure sensitive adhesive acrylic polymer having an ethylenically unsaturated group, such as a (meth)acrylic group, and optionally, a photopolymerization initiator, such as a benzophenone compound and an acetophenone compound. By irradiating the UV curable acrylic pressure sensitive adhesive with ultraviolet rays, polymerization of the ethylenically unsaturated group proceeds, so that the cohesive force of the pressure sensitive adhesive increases and the wettability thereof decreases. As a result, the adhesive strength of the pressure sensitive adhesive decreases, and the fixing tape can be peeled off and removed from the device wafer without damaging the device wafer. The pressure sensitive adhesive acrylic polymer may be crosslinked by an isocyanate compound, a melamine-formaldehyde resin, an epoxy compound, etc. The pressure sensitive adhesive acrylic polymer may have a benzophenone structure in the side chain thereof to have self-photopolymerizability.

EXAMPLES

Hereinafter, the present invention will be described in more detail based on the Examples, but the present invention is not limited by the Examples.

Preparation of Decomposing Cleaning Compositions (5% by Mass TBAF/Mixed Solvents)

Example 1

To a 125 mL polyethylene container, 0.272 g of tetrabutylammonium fluoride trihydrate (TBAF·3H$_2$O) (Kanto Chemical Co., Inc., 97% special grade) was added, and then 3.135 g of N-methyl-2-pyrrolidone (hereinafter, referred to as "NMP") was added, followed by adding and mixing 0.976 g of dimethyl sulfoxide (hereinafter, referred to as "DMSO") as an organic sulfur oxide to dissolve TBAF·3H$_2$O. In this way, a decomposing cleaning composition of 5% by mass TBAF/mixed solvents was prepared in which the mass ratio of NMP:DMSO was 0.763:0.237.

Examples 2 to 7 and Comparative Examples 1 to 4

Except that the compositions were changed as shown in Table 1, the decomposing cleaning compositions were prepared in the same manner as in Example 1.

Preparation of Test Piece for Penetration Test

A 12 inch (300 mm) silicon wafer (770 μm thick) was divided and cut into squares of 3 cm×3 cm. This is referred to as a Si test piece. A Si wafer fixing tape, in which a UV curable acrylic pressure sensitive adhesive layer was subjected to ultraviolet irradiation treatment, was cut to a size of 2 cm×2 cm square, a cover film was removed, and the Si wafer fixing tape from which a cover film had been removed was adhered to the center of the Si test piece to prepare a test piece for penetration test. In the outside of each side of the Si wafer fixing tape, a surface of the Si test piece was exposed at a width 0.5 cm. The Si wafer fixing tape was a 170 μm thick laminate including a 50 μm thick polyester substrate, a 100 μm thick acrylic interlayer, and a 20 μm thick UV curable acrylic pressure sensitive adhesive layer in this order.

Penetration Test

A test piece for penetration test was placed in a SUS304 petri dish having a diameter of 50 mm and a depth of 15 mm, so that a Si wafer fixing tape faced upward. 3.5 mL of the decomposing cleaning composition (5% by mass TBAF/solvents) was added to the SUS304 petri dish by using a pipette, and the test piece was immersed in the decomposing cleaning composition and covered with a glass petri dish. After the test piece was immersed in the decomposing cleaning composition at room temperature (25° C.) for 30 minutes, the test piece was removed by using tweezers, and rinsed thoroughly by using a wash bottle of ion-exchanged water (DIW), and thereafter water was removed by spraying nitrogen gas to the test piece, which was then sufficiently dried at room temperature. Photographs of the test piece after immersion and drying were taken on the surface to which the Si wafer fixing tape was attached. The penetration length of the decomposing cleaning composition into a contact interface between the acrylic pressure sensitive adhesive layer of the Si wafer fixing tape and the Si test piece was measured as a maximum linear distance from each side of the tape to a penetration mark along a direction perpendicular to that side of the tape in the form of a square. The average penetration length (mm) was obtained by calculating the average value of the penetration lengths of four sides of the Si fixing tape in the form of a square, and the average penetration length was divided by the immersion time of 30 minutes to calculate the average penetration speed (mm/min). The masses of the Si test piece and the test piece for penetration test (Si test piece+Si wafer fixing tape) before immersion and after immersion, washing with water and drying were weighed, and the mass increase and mass increase rate of the tape ater immersion were calculated.

Method a for Preparing Test Piece for Cleaning Test

On a 12 inch (300 mm) silicon wafer (770 μm thick), an addition-curable silicone resin was applied by spin coating so as to have a dry film thickness of 110 μm. Thereafter, an adhesive layer containing a polyorganosiloxane compound as an adhesive polymer was formed on the silicon wafer by heating on a hot plate at 140° C. for 15 minutes and at 190° C. for 10 minutes. The silicon wafer having the adhesive layer was divided into a size of 4 cm×4 cm to obtain a test piece for cleaning test, and the thickness of the center portion of the test piece was measured using a micrometer.

Cleaning Test 1

To a SUS petri dish having a diameter of 90 mm, 7.0 mL of the decomposing cleaning composition immediately after preparation (within 30 minutes after preparation) was added. One test piece for cleaning test prepared by the above method A was immersed in the decomposing cleaning composition, and the petri dish was shaken back and forth at a frequency of 1 Hz for 5 minutes at room temperature (25° C.). After the immersion, the test piece was removed by using tweezers, immersed in isopropyl alcohol (IPA), and further rinsed thoroughly by using an IPA wash bottle. Thereafter, the test piece was immersed in ion-exchanged water (DIW) and thoroughly rinsed by using a DIW wash bottle in the same manner. After spraying nitrogen gas to the test piece to remove water attached thereon, the test piece was heated and dried in a dryer at 125° C. for 30 minutes. The thickness of the center portion of the test piece after drying was measured using a micrometer.

The etch rate (ER) of the decomposing cleaning composition was calculated by dividing the difference in the thicknesses of the test piece before and after immersion by the immersion time in the decomposing cleaning composition.

Etch rate (ER)(μm/min)=[(thickness of test piece before immersion−thickness of test piece after immersion, washing and drying)(μm)]/immersion time (5 min)

Table 1 shows the compositions of the decomposing cleaning compositions of Examples 1 to 7 and Comparative Examples 1 to 4, and the results of the penetration test and Cleaning test 1.

TABLE 1

| | | Example 1 | Example 2 | Example 3 | Example 4 | Example 5 | Example 6 | Example 7 |
|---|---|---|---|---|---|---|---|---|
| Decomposing cleaning composition (5 mass % TBAF) | NMP | 0.763 | 0.616 | 0.382 | 0.965 | 0.854 | 0.614 | 0.618 |
| | N,N-Dimethylpropionamide | — | — | — | — | — | — | — |
| | DMSO | 0.237 | 0.384 | 0.618 | — | — | — | 0.236 |
| | Sulfolane | — | — | — | 0.035 | 0.146 | 0.386 | 0.146 |
| | Methyl ethyl ketone | — | — | — | — | — | — | — |
| | Organic sulfur oxide in aprotic solvent [mass %] | 23.7 | 38.4 | 61.8 | 3.5 | 14.6 | 38.6 | 38.2 |
| Penetration length from each side of tape after immersion for 30 minutes [mm] | | 3.43 | 3.38 | 1.38 | 0.609 | 0.421 | 0.195 | 3.02 |
| | | 3.54 | 3.02 | 1.81 | 0.558 | 0.495 | 0.244 | 3.16 |
| | | 3.66 | 3.31 | 1.60 | 0.609 | 0.470 | 0.293 | 2.34 |
| | | 3.13 | 3.11 | 1.43 | 0.609 | 0.668 | 0.244 | 3.09 |
| (A) Average penetration length [mm] | | 3.44 | 3.20 | 1.56 | 0.596 | 0.514 | 0.244 | 2.90 |
| Average penetration speed [mm/min] (= (A)/30) | | 0.11 | 0.11 | 0.05 | 0.02 | 0.02 | 0.01 | 0.10 |
| Mass of test piece before immersion | Tape + Si test piece [g] | 1.642 | 1.695 | 1.643 | 1.639 | 1.644 | 1.634 | 1.642 |
| | (B) Tape only [g] | 0.087 | 0.086 | 0.088 | 0.084 | 0.089 | 0.079 | 0.087 |
| Mass of test piece after immersion, washing with water and drying | Tape + Si test piece [g] | 1.666 | 1.717 | 1.656 | 1.641 | 1.646 | 1.636 | 1.659 |
| | (C) Tape only [g] | 0.109 | 0.107 | 0.099 | 0.086 | 0.091 | 0.080 | 0.101 |
| (D) Increase in mass of tape after 30 minutes of immersion [g] (= (C) − (B)) | | 0.022 | 0.021 | 0.011 | 0.002 | 0.002 | 0.001 | 0.014 |
| Tape mass increase [%] (= (D)/(B) × 100) | | 25.3 | 24.4 | 12.5 | 2.4 | 2.2 | 1.3 | 16.0 |
| Etch rate of Cleaning test 1 [μm/min] | | 3.2 | 2.6 | 1.4 | 4.8 | 3.4 | 1.0 | 2.4 |

| | | Comp. Example 1 | Comp. Example 2 | Comp. Example 3 | Comp. Example 4 |
|---|---|---|---|---|---|
| Decomposing cleaning composition (5 mass % TMAF) | NMP | 1.000 | — | — | — |
| | N,N-Dimethylpropionamide | — | — | 1.000 | — |
| | DMSO | — | 1.000 | — | — |
| | Sulfolane | — | — | — | — |
| | Methyl ethyl ketone | — | — | — | 1.000 |
| | Organic sulfur oxide in aprotic solvent [mass %] | 0 | 100 | 0 | 0 |
| Penetration length from each side of tape after immersion for 30 minutes [mm] | | 3.98 | 0.306 | 6.29 | >10[1] |
| | | 3.98 | 0.322 | 6.01 | >10[1] |
| | | 4.45 | 0.321 | 6.31 | >10[1] |
| | | 3.68 | 0.341 | 5.44 | >10[1] |
| (A) Average penetration length [mm] | | 4.02 | 0.32 | 6.01 | >10[1] |
| Average penetration speed [mm/min] (= (A)/30) | | 0.13 | 0.01 | 0.20 | Approx. 0.80[2] |
| Mass of test piece before immersion | Tape + Si test piece [g] | 1.690 | 1.637 | 1.622 | — |
| | (B) Tape only [g] | 0.081 | 0.082 | 0.084 | — |
| Mass of test piece after immersion, washing with water and drying | Tape + Si test piece [g] | 1.721 | 1.639 | 1.744 | — |
| | (C) Tape only [g] | 0.112 | 0.084 | 0.206 | — |
| (D) Increase in mass of tape after 30 minutes of immersion [g] (= (C) − (B)) | | 0.031 | 0.002 | 0.122 | — |
| Tape mass increase [%] (= (D)/(B) × 100) | | 38.3 | 2.4 | 145.2 | — |
| Etch rate of Cleaning test 1 [μm/min] | | 5.0 | 0.2 | 6.4 | 12.0 |

[1]Reached the center

[2]Reached the center in 12.5 minutes (10 mm/12.5 minutes = about 0.80 mm/minute)

In Examples 1 to 3 (NMP-DMSO), it was possible to suppress the penetration by increasing the DMSO ratio while ensuring the etch rate. Even in Examples 4 to 6 (NMP-sulfolane), it was possible to further suppress the penetration while ensuring the etch rate, and an effect was observed with a smaller amount of sulfolane added than that of DMSO. Further, in Example 7 (NMP-DMSO-sulfolane), it was possible to further suppress the penetration while ensuring the etch rate. Since the mass changes before and after the immersion of the tape are smaller than those of the Comparative Examples, it can be understood that the penetration of the decomposing cleaning composition into a contact interface between the acrylic pressure sensitive adhesive layer of the Si wafer fixing tape and the Si wafer was suppressed by adding DMSO or sulfolane.

In Comparative Example 1 (NMP only) and Comparative Example 3 (N,N-dimethylpropionamide only), even though the etch rates were high, the penetration lengths at the immersion time of 30 minutes were large, the Si wafer fixing tapes swelled, and wrinkles were generated in the Si wafer fixing tapes. In Comparative Example 2 (DMSO only), while the penetration length was small, the etch rate was extremely low at 0.2 μm/min. Comparative Example 4 (only methyl ethyl ketone) could not be evaluated, since the decomposing cleaning composition quickly penetrated into the center portion.

Method B for Preparing Test Piece for Cleaning Test

Except that the silicon wafer having the adhesive layer was divided into a size of 1.5 cm×1.5 cm to form test pieces, silicon wafer test pieces were prepared in the same manner as in the above method A.

Cleaning Test 2

A screw tube bottle having a volume of 50 mL was placed on top of a magnetic stirrer. To the screw tube bottle, 15.0 mL of the decomposing cleaning composition immediately after preparation (within 30 minutes after preparation) and a stirrer were added. One test piece prepared by the above method B was immersed in the decomposing cleaning composition, and the stirrer was rotated at a rotation speed of 900 rpm for 3 minutes at room temperature (25° C.). After the immersion, the test piece was removed by using tweezers and thoroughly rinsed by using an isopropyl alcohol (IPA) wash bottle. After spraying nitrogen gas to the test piece to dry, the thickness of the center portion of the test piece was measured using a micrometer.

The etch rate (ER) of the decomposing cleaning composition was calculated by dividing the difference in the thicknesses of the test piece before and after immersion by the immersion time in the decomposing cleaning composition.

Etch rate (ER)(μm/min)=[(thickness of test piece before immersion−thickness of test piece after immersion, washing and drying)(μm)]/immersion time (3 min)

Method C for Preparing Test Piece for Cleaning Test

A 12 inch (300 mm) silicon wafer (770 μm thick) was divided into a size of 1.5 cm×1.5 cm. An adhesive obtained by mixing 2.036 g of a main agent of SYLGARD® 184 (manufactured by Toray Dow Corning Co., Ltd.) and 0.209 g of a curing agent was sucked out by a Pasteur pipette, and one drop were placed onto the divided silicon wafer. Thereafter, the silicon wafer was heated in a dryer at 125° C. for 20 minutes to form an adhesive layer on the silicon wafer. This was made to be a test piece, and the thickness of the center portion of the test piece was measured using a micrometer.

Cleaning Test 3

Except that the test piece prepared by the above method C was used, the etch rate (ER) of the decomposing cleaning composition was calculated in the same manner as in Cleaning test 2.

Table 2 shows the compositions of the decomposing cleaning compositions of Examples 1 to 5 and 7 and Comparative Examples 1 to 4, and the results of Cleaning test 2 and Cleaning test 3.

TABLE 2

| | | Example 1 | Example 2 | Example 3 | Example 4 | Example 5 | Example 7 |
|---|---|---|---|---|---|---|---|
| Decomposing cleaning composition (5 mass % TMAF) | NMP | 0.763 | 0.616 | 0.382 | 0.965 | 0.854 | 0.618 |
| | N,N-Dimethylpropionamide | — | — | — | — | — | — |
| | DMSO | 0.237 | 0.384 | 0.618 | — | — | 0.236 |
| | Sulfolane | — | — | — | 0.035 | 0.146 | 0.146 |
| | Methyl ethyl ketone | — | — | — | — | — | — |
| | Organic sulfur oxide in aprotic solvent [mass %] | 23.7 | 38.4 | 61.8 | 3.5 | 14.6 | 38.2 |
| Etch rate of Cleaning test 2 [μm/min] | | 5.3 | 2.7 | 1.7 | 8.0 | 5.0 | 1.0 |
| Etch rate of Cleaning test 3 [μm/min] | | 5.0 | 3.0 | 1.3 | 9.0 | 3.0 | 1.0 |

| | | Comp. Example 1 | Comp. Example 2 | Comp. Example 3 | Comp. Example 4 |
|---|---|---|---|---|---|
| Decomposing cleaning composition (5 mass % TMAF) | NMP | 1.000 | — | — | — |
| | N,N-Dimethylpropionamide | — | — | 1.000 | — |
| | DMSO | — | 1.000 | — | — |
| | Sulfolane | — | — | — | — |
| | Methyl ethyl ketone | — | — | — | 1.000 |
| | Organic sulfur oxide in aprotic solvent [mass %] | 0 | 100 | 0 | 0 |
| Etch rate of Cleaning test 2 [μm/min] | | 10.0 | <0.3 | 10.3 | 17.7 |
| Etch rate of Cleaning test 3 [μm/min] | | 9.3 | <0.3 | 9.7 | 31.3 |

Example 8 and Comparative Example 5

Except that N-ethyl-2-pyrrolidone (NEP) was used as the N-substituted amide compound, and the compositions were changed as shown in Table 3, the decomposing cleaning compositions were prepared in the same manner as in Example 1.

Table 3 shows the compositions of the decomposing cleaning compositions of Example 8 and Comparative Example 5, and the results of the penetration test, and Cleaning tests 2 and 3.

TABLE 3

| | | Example 8 | Comp. Example 5 |
|---|---|---|---|
| Decomposing cleaning composition (5 mass % TBAP) | NEP | 0.854 | 1.000 |
| | Sulfolane | 0.146 | — |
| | Organic sulfur oxide in aprotic solvent [mass %] | 14.6 | 0 |
| Penetration length from each side of tape after immersion for 30 minutes [mm] | | 3.30 | 4.67 |
| | | 3.38 | 5.72 |
| | | 3.67 | 5.44 |
| | | 3.30 | 4.24 |
| (A) Average penetration length [mm] | | 3.41 | 5.02 |
| Average penetration speed [mm/min] (=(A)/30) | | 0.11 | 0.17 |
| Mass of test piece before immersion | Tape + Si test piece [g] | 1.692 | 1.697 |
| | (B) Tape only [g] | 0.085 | 0.088 |
| Mass of test piece after immersion washing with water, and drying | Tape + Si test piece [g] | 1.718 | 1.739 |
| | (C) Tape only [g] | 0.109 | 0.130 |
| (D) Increase in mass of tape after 30 minutes of immersion [g] (=(C) − (B)) | | 0.024 | 0.042 |
| Tape mass increase [%] (=(D)/(B) × 100) | | 28.2 | 47.7 |
| Etch rate [µm/min] for Cleaning test 2 | | 7.3 | 11.0 |
| Etch rate [µm/min] for Cleaning test 3 | | 7.0 | 16.3 |

Example 9 and Comparative Example 6

Except that 1,3-dimethyl-2-imidazolidinone (DMI) was used as the N-substituted amide compound, and the compositions were changed as shown in Table 4, the decomposing cleaning compositions were prepared in the same manner as in Example 1.

Table 4 shows the compositions of the decomposing cleaning compositions of Example 9 and Comparative Example 6, and the result of the penetration test, and Cleaning tests 2 and 3.

TABLE 4

| | | Example 9 | Comp. Example 6 |
|---|---|---|---|
| Decomposing cleaning composition (5 mass % TBAF) | DMI | 0.965 | 1.000 |
| | Sulfolane | 0.035 | — |
| | Organic sulfur oxide in aprotic solvent [mass %] | 3.5 | 0 |
| Penetration length from each side of tape after immersion for 30 minutes [mm] | | 2.32 | 3.77 |
| | | 2.33 | 3.59 |
| | | 2.45 | 3.74 |
| | | 2.40 | 3.90 |
| (A) Average penetration length [mm] | | 2.38 | 3.75 |
| Average penetration speed [mm/min] (=(A)/30) | | 0.08 | 0.13 |
| Mass of test piece before immersion | Tape + Si test piece [g] | 1.694 | 1.691 |
| | (B) Tape only [g] | 0.085 | 0.083 |
| Mass of test piece after immersion, washing with water, and drying | Tape + Si test piece [g] | 1.715 | 1.718 |
| | (C) Tape only [g] | 0.106 | 0.110 |
| (D) Increase in mass of tape after 30 minutes of immersion [g] (=(C) − (B)) | | 0.021 | 0.027 |
| Tape mass increase [%] (=(D)/(B) × 100) | | 24.7 | 32.5 |
| Etch rate [µm/min] tor Cleaning test 2 | | 5.7 | 6.3 |
| Etch rate [µm/min] for Cleaning test 3 | | 2.3 | 4.3 |

INDUSTRIAL APPLICABILITY

The decomposing cleaning composition of the present disclosure can be suitably used for applications in which a residue of an adhesive used in a thinning process of a semiconductor wafer, in particular, an adhesive including a polyorganosiloxane compound as an adhesive polymer, on a device wafer is decomposed and cleaned.

The invention claimed is:

1. A decomposing cleaning composition of an adhesive polymer comprising a quaternary alkylammonium fluoride or a hydrate of a quaternary alkylammonium fluoride, and an aprotic solvent, wherein the aprotic solvent comprises (A) an N-substituted amide compound having no active hydrogen on a nitrogen atom, and
(B) at least one organic sulfur oxide selected from the group consisting of a sulfoxide compound and a sulfone compound,
the content of the (A) N-substituted amide compound is 30 to 99% by mass and the content of the (B) organic sulfur oxide is 1 to 70% by mass, with respect to 100% by mass of the aprotic solvent,
the content of the quaternary alkylammonium fluoride is 0.1 to 15% by mass,
the (A) N-substituted amide compound is at least one selected from the group consisting of N-methylpyrrolidone, N-ethylpyrrolidone, and 1,3-dimethyl-2-imidazolidinone,
the (B) organic sulfur oxide is at least one selected from the group consisting of dimethyl sulfoxide and sulfolane, and
the quaternary alkylammonium fluoride is tetrabutylammonium fluoride.

2. The decomposing cleaning composition according to claim 1, wherein the (A) N-substituted amide compound is N-methylpyrrolidone or N-ethylpyrrolidone.

3. The decomposing cleaning composition according to claim 1, wherein the organic sulfur oxide compound is dimethyl sulfoxide.

4. The decomposing cleaning composition according to claim 1, wherein the organic sulfur oxide compound is sulfolane.

5. The decomposing cleaning composition according to claim 1, wherein the content of the (A) N-substituted amide compound is 50 to 99% by mass and the content of the (B) organic sulfur oxide is 1 to 50% by mass, with respect to 100% by mass of the aprotic solvent.

6. The decomposing cleaning composition according to claim 1, wherein the content of the (A) N-substituted amide compound is 70 to 98% by mass and the content of the (B) organic sulfur oxide is 2 to 30% by mass, with respect to 100% by mass of the aprotic solvent.

7. The decomposing cleaning composition according to claim 1, wherein the adhesive polymer is a polyorganosiloxane compound.

8. A method for cleaning an adhesive polymer on a substrate by using the decomposing cleaning composition according to claim 1.

9. The method according to claim 8, comprising carrying out the cleaning with the substrate in contact with an acrylic pressure sensitive adhesive.

10. A method for producing a device wafer comprising cleaning an adhesive polymer on a front surface of a device wafer by using the decomposing cleaning composition according to claim 1.

11. The method according to claim 10, comprising carrying out the cleaning with the device wafer in contact with an acrylic pressure sensitive adhesive.

12. The decomposing cleaning composition according to claim 1, wherein the content of the aprotic solvent in the decomposing cleaning composition is 70 to 99.9% by mass.

13. The decomposing cleaning composition according to claim 1, wherein the aprotic solvent comprises N-methylpyrrolidone and dimethyl sulfoxide.

14. The decomposing cleaning composition according to claim 1, wherein the aprotic solvent comprises N-methylpyrrolidone and sulfolane.

15. The decomposing cleaning composition according to claim 1, wherein the aprotic solvent comprises N-ethylpyrrolidone and dimethyl sulfoxide.

16. The decomposing cleaning composition according to claim 1, wherein the aprotic solvent comprises N-ethylpyrrolidone and sulfolane.

17. The decomposing cleaning composition according to claim 1, wherein the aprotic solvent comprises 1,3-dimethyl-2-imidazolidinone and dimethyl sulfoxide.

18. The decomposing cleaning composition according to claim 1, wherein the aprotic solvent comprises 1,3-dimethyl-2-imidazolidinone and sulfolane.

19. The decomposing cleaning composition according to claim 1, wherein the aprotic solvent comprises N-methylpyrrolidone, dimethyl sulfoxide, and sulfolane.

* * * * *